United States Patent
Wahl

(10) Patent No.: US 10,297,697 B1
(45) Date of Patent: May 21, 2019

(54) CODED APERTURE SYSTEM OF IMAGING WITH A PLURALITY OF DETECTORS IN A SPACED-APART CONFIGURATION

(71) Applicant: H3D, Inc., Ann Arbor, MI (US)

(72) Inventor: Christopher G. Wahl, Ann Arbor, MI (US)

(73) Assignee: H3D, Inc., Ann Arbor, MI (US)

( * ) Notice: Subject to any disclaimer, the term of this patent is extended or adjusted under 35 U.S.C. 154(b) by 0 days.

(21) Appl. No.: 16/177,772

(22) Filed: Nov. 1, 2018

(51) Int. Cl.
| | |
|---|---|
| H01L 31/0232 | (2014.01) |
| H01L 31/02 | (2006.01) |
| G01T 1/24 | (2006.01) |
| G02B 27/00 | (2006.01) |
| H01L 31/0296 | (2006.01) |

(52) U.S. Cl.
CPC ........ H01L 31/02024 (2013.01); G01T 1/244 (2013.01); H01L 31/02325 (2013.01); G02B 27/00 (2013.01); G02B 2207/129 (2013.01); H01L 31/02966 (2013.01)

(58) Field of Classification Search
CPC .. G01T 1/244; G02B 2207/129; G02B 27/00; H01L 31/02024; H01L 31/02325; H01L 31/02966
See application file for complete search history.

(56) References Cited

U.S. PATENT DOCUMENTS

| | | | |
|---|---|---|---|
| 7,592,602 B2 | 9/2009 | Ziock | |
| 9,549,134 B2* | 1/2017 | Suh | G09G 3/3406 |
| 2009/0167922 A1* | 7/2009 | Perlman | H04N 5/357 348/340 |
| 2009/0273843 A1* | 11/2009 | Raskar | G02B 27/0018 359/601 |
| 2013/0038766 A1* | 2/2013 | Perlman | H04N 5/3572 348/294 |
| 2014/0184754 A1* | 7/2014 | Suh | H04N 13/232 348/50 |
| 2018/0341858 A1* | 11/2018 | Otterstedt | G06N 3/08 |

OTHER PUBLICATIONS

R.D. Penny et al., A dual-sided coded-aperture radiation detection system, Nuclear Instruments and Methods in Physics Research Section A: Accelerators, Spectrometers, Detectors and Associated Equipment, Oct. 1, 2011, pp. 578-581, Science Direct, vol. 652, Issue 1.

* cited by examiner

Primary Examiner — Mark R Gaworecki
(74) Attorney, Agent, or Firm — Quinn IP Law

(57) ABSTRACT

A system for imaging at least one source of radiation with a mask and a plurality of detectors. The mask is characterized by a base pattern and configured to selectively transmit or block the radiation striking the mask based in part on the base pattern. The mask includes a plurality of tiles each repeating the base pattern. The number of the detectors is N and each of the tiles is divided into N respective portions. The plurality of detectors is positioned in a spaced apart configuration such that each of the plurality of detectors captures the radiation passing through different ones of the N respective portions of the plurality of tiles. The different ones of the N respective portions combine to form the base pattern.

20 Claims, 3 Drawing Sheets

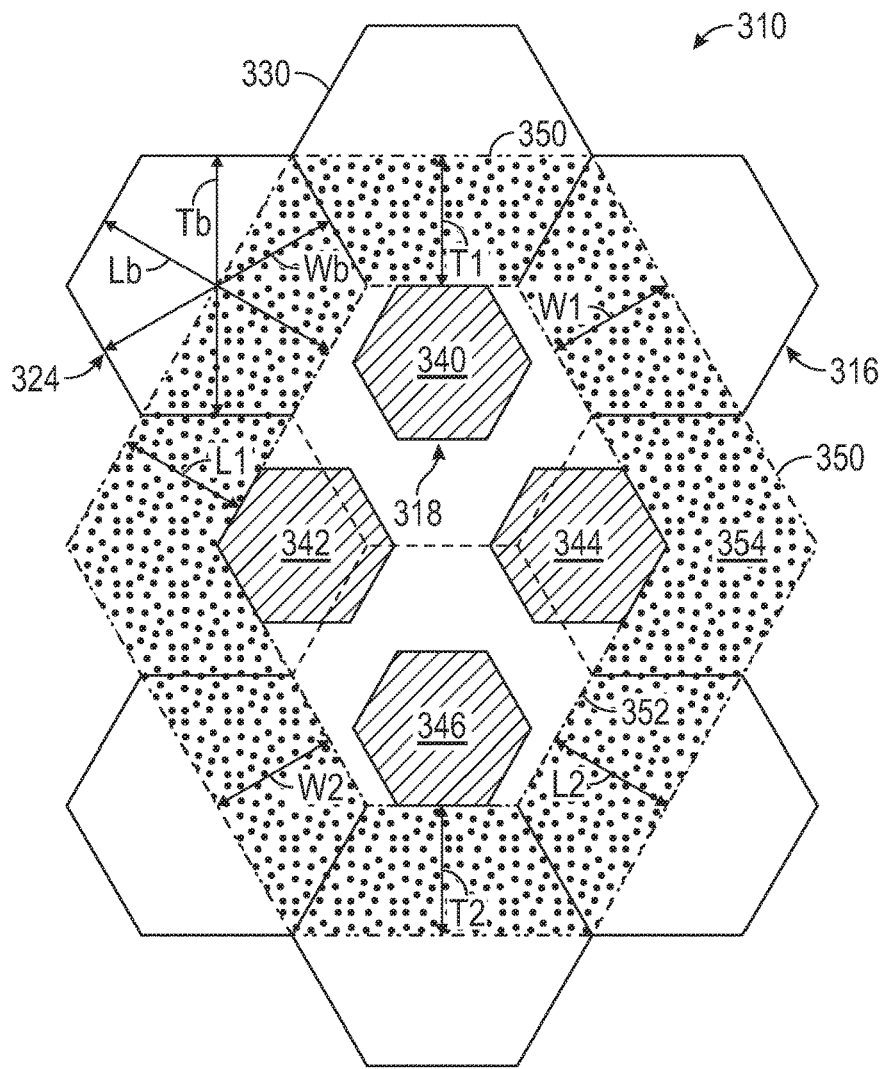
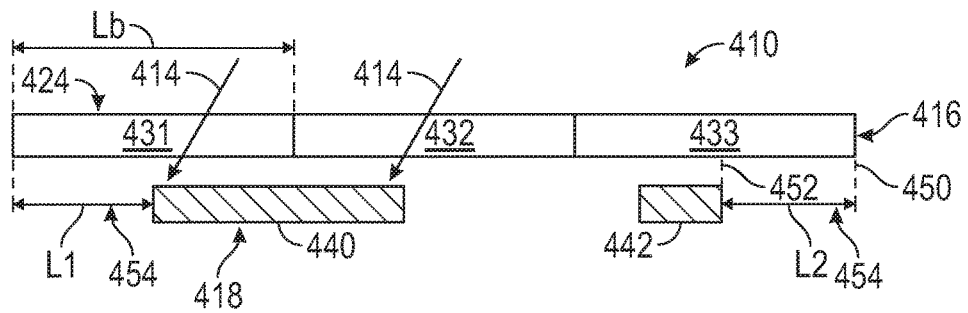
FIG. 4
FIG. 5

CODED APERTURE SYSTEM OF IMAGING WITH A PLURALITY OF DETECTORS IN A SPACED-APART CONFIGURATION

STATEMENT REGARDING FEDERALLY-SPONSORED RESEARCH OR DEVELOPMENT

This invention was made with Government support under Agreement No. HDTRA1-14-C-0129, awarded by the United States Department of Defense. The United States Government may have certain rights in this invention.

INTRODUCTION

The present disclosure relates generally to a coded aperture system for imaging at least one source of radiation and a corresponding method. The system includes a mask and a plurality of detectors in a spaced-apart configuration. Coded aperture devices may be employed to block radiation by casting a coded shadow upon a plane and mathematically reconstructing the properties of the source of radiation from this shadow. To obtain a coded-aperture image of sufficient quality, a detector with a single continuous focal plane is generally required. This is because the image quality degrades if there are gaps between the detectors.

SUMMARY

Disclosed herein is a coded aperture system for imaging at least one source of radiation and a corresponding method. The system includes a mask and a plurality of detectors positioned on a detector plane spaced apart from the mask. The mask is characterized by a base pattern, the mask being configured to selectively transmit and selectively block the radiation striking the mask based in part on the base pattern. The mask includes a plurality of tiles each repeating the base pattern. A number of the plurality of detectors is N and each of the plurality of tiles is divided into N respective portions.

The plurality of detectors is positioned in a spaced apart configuration such that each of the plurality of detectors captures the radiation passing through different ones of the N respective portions of the plurality of tiles. The different ones of the N respective portions combine to form the base pattern. The combination of the N respective portions of the plurality of tiles is unique for each position of the source. The system enables a full sampling of the base pattern without having a continuous plane of detectors. The system enables an image of good quality, even with gaps between detectors.

In one embodiment, the number of the plurality of detectors is exactly four. Here, each of the plurality of tiles is divided into four respective portions, including a first respective portion, a second respective portion, a third respective portion and a fourth respective portion. A first of the plurality of detectors is positioned to capture the radiation passing through the respective first portion of a first of the plurality of tiles. A second of the plurality of detectors is positioned to capture the radiation passing through the respective second portion of a second of the plurality of tiles. A third of the plurality of detectors is positioned to capture the transmitted radiation passing through the respective third portion of a third of the plurality of tiles. A fourth of the plurality of detectors is positioned to capture the transmitted radiation passing through the respective fourth portion of a fourth of the plurality of tiles.

A controller is in communication with the plurality of detectors and has a processor and tangible, non-transitory memory on which instructions are recorded. Execution of the instructions by the processor causes the controller to reconstruct an image of the source. In one example, at least two of the plurality of detectors have a dissimilar size. In another example, the plurality of detectors is configured to be position sensitive. The base pattern may be fully sampled by the plurality of detectors without a continuous detector plane. In one example, the base pattern is a modified uniformly redundant array (MURA) pattern. In yet another example, the detector and the mask are shaped as squares, with the quantity (Q) of the plurality of tiles and the number (N) of the plurality of detectors are both a square of an integer and has a minimum value of four.

The plurality of detectors and the mask may define a detector boundary and a mask boundary, respectively. A peripheral region is defined between the detector boundary and the mask boundary, the peripheral region defining first and second peripheral lengths in a first direction. The base pattern of the mask defines a base pattern length in the first direction. A magnified base pattern length is obtained by the base pattern length multiplied by a magnification factor, the magnification factor being a ratio of a source-to-detector distance and a source-to-mask distance. In one example, the system is configured such that a first sum of the first and second peripheral lengths is greater than zero and less than the magnified base pattern length.

In one example, the detector boundary is an outer-most rectangle drawn with the plurality of detectors inside and the mask boundary is the outer-most rectangle drawn with the plurality of tiles inside. The base pattern of the mask may define a base pattern width in a second direction perpendicular to the first direction. A magnified base pattern width is obtained by the base pattern width multiplied by the magnification factor. The peripheral region may define first and second peripheral widths in the second direction. The system may be configured such that a second sum of the first and second peripheral widths is greater than zero and less than the magnified base pattern width.

In one example, the detector boundary is an outer-most hexagon drawn with the plurality of detectors inside. The base pattern of the mask defines a base pattern length in a first direction, a base pattern width in a second direction and a base pattern depth in a third direction. The peripheral region defines first and second peripheral widths in the second direction as well as first and second peripheral depths in the third direction. A magnified base pattern width and a magnified base pattern depth is obtained by the base pattern width and the base pattern depth multiplied by the magnification factor, respectively. The system is configured such that a second sum of the first and second peripheral widths is greater than zero and less than the magnified base pattern width, and a third sum of the first and second peripheral depths is greater than zero and less than the magnified base pattern depth.

The base pattern of the mask defines a base area. A magnified base area is obtained by the base area multiplied by a square of the magnification factor. The system may be configured such that a sum of respective areas of the plurality of detector is greater than or equal to the magnified base area. In one example, the mask may include at least one partial tile that repeats a portion of the base pattern (and not the full pattern), with the image of the source including the radiation passing through the partial tile, i.e., the image is formed using counts that are due to radiation passing through the partial tile.

The above features and advantages and other features and advantages of the present disclosure are readily apparent from the following detailed description of the best modes for carrying out the disclosure when taken in connection with the accompanying drawings.

BRIEF DESCRIPTION OF THE DRAWINGS

FIG. 4 is a schematic plan view of a fourth example of a coded aperture system with a plurality of detectors in a spaced-apart configuration, the plurality of detectors having a hexagonal shape; and FIG. 5 is a schematic side sectional view of a fifth example of a coded aperture system with a plurality of detectors in a spaced-apart configuration, the plurality of detectors being one-dimensional.

DETAILED DESCRIPTION

Figure 1:
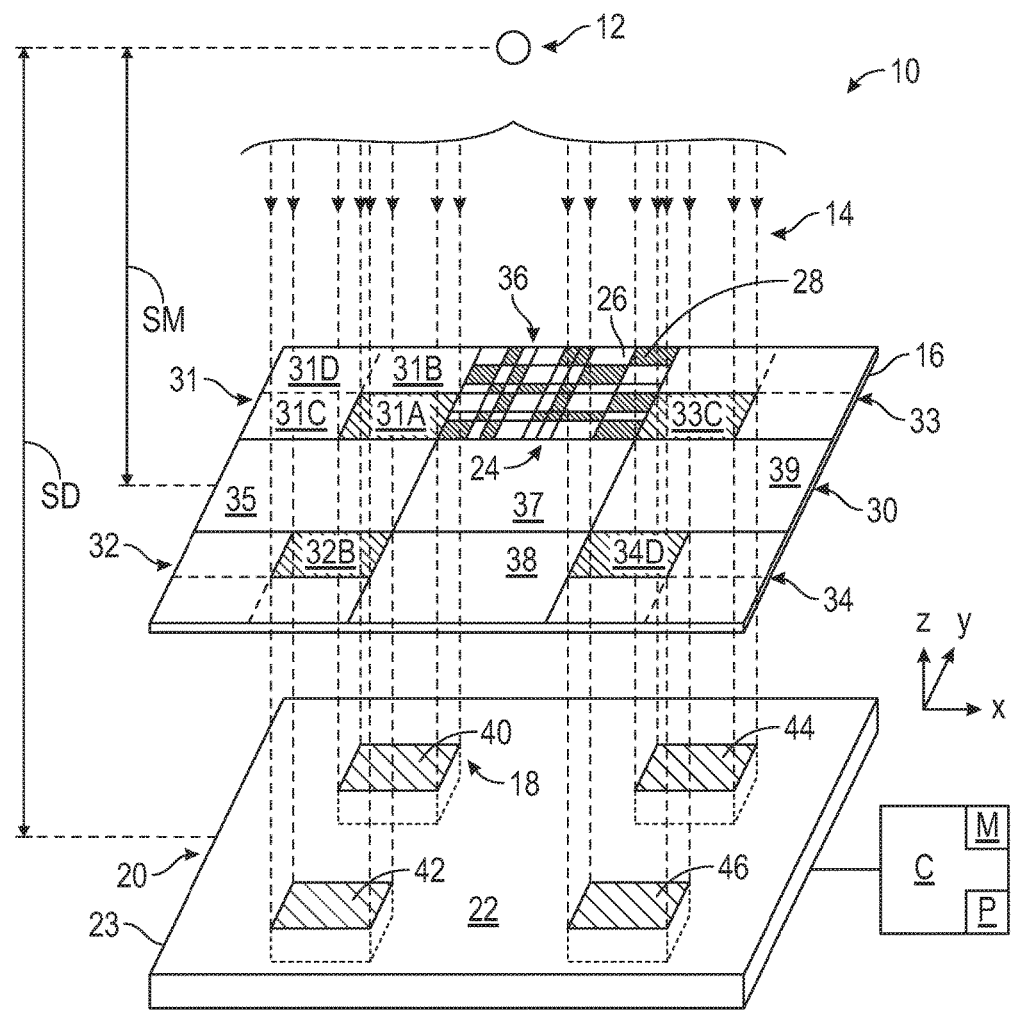
FIG. 1 is a first example of a schematic perspective view of a coded aperture system with a plurality of detectors in a spaced-apart configuration.

Referring to the drawings, wherein like reference numbers refer to like components, FIG. 1 schematically illustrates a coded aperture system 10 (hereinafter referred to as "system 10") for imaging at least one source 12 that generates radiation 14. The source 12 may emit any type of radiation phenomenon known to those skilled in the art, including but not limited to, alpha, beta, electromagnetic radiation and neutrons. It is to be understood that the system 10 may take many different forms and include multiple and/or alternate components and facilities. For reference purposes, an XYZ axis is shown in FIG. 1.

Referring to FIG. 1, the system 10 includes a mask 16 positioned such that the radiation 14 strikes against the mask 16 prior to striking a plurality of detectors 18. The plurality of detectors 18 ("plurality of" omitted henceforth) is positioned in a spaced-apart configuration 20 (or discontinuous configuration) on a detector plane 22 spaced apart from the mask 16. The mask 16 and the detector plane 22 may be parallel to one another. The detectors 18 may be embedded, mounted, affixed or otherwise connected on a template 23. In one example, the template 23 is a circuit board. In another example, the template 23 is composed of an inorganic polymer.

Referring to FIG. 1, the mask 16 is characterized by a base pattern 24. The mask 16 is configured to selectively transmit and selectively block the radiation 14 striking the mask 16 based in part on the base pattern 24. The base pattern 24 includes multiple elements of varying attenuation, shape and size, including at least one open element 26 and at least one closed element 28 (shown shaded in FIGS. 1 and 2). The shapes of the multiple elements may include, but are not limited to, circles, squares, hexagons and rectangles.

Referring to FIG. 1, the closed element 28 is configured with a significantly higher attenuation rate than the open element 26. For example, the open element 26 may be composed of a layer of polymer or glass while the closed element 28 may be composed of tungsten. Alternatively, the open element 26 may be a through hole in the mask 16. The respective attenuation rates of the open element 26 and the closed element 28 may be varied based on the application at hand. It is understood that the base pattern 24 is not limited to the number and sequence shown in FIG. 1, which is intended to be a non-limiting example. In one example, the base pattern 24 is a modified uniformly redundant array (MURA) pattern.

A single detector with a single continuous plane is generally required to completely sample the base pattern 24 in order to obtain excellent quality images. This is because gaps between the detectors 18 reduces image quality. To reduce the effect of the gap, the intuitive approach would be to push the detectors 18 as close as possible. As will be described below, the system 10 involves arranging the detectors 18 so that the entire base pattern 24 is completely sampled in a single measurement, using each of the plurality of detectors 18 partly or fully. The approach in system 10 is non-obvious as it spreads the detectors 18 out even further, which is counter-intuitive.

Referring to FIG. 1, the mask 16 is divided into a plurality of tiles 30 ("plurality of" omitted henceforth) each repeating the base pattern 24. Some of the tiles 30 may repeat a portion of the base pattern 24. In the embodiment shown in FIG. 1, the mask 16 is divided into first, second, third, fourth, fifth, sixth, seventh, eighth and ninth tiles 31, 32, 33, 34, 35, 36, 37, 38, 39. Here, the base pattern 24 is tiled nine times to give a field of view such that for any point in the field of view, a unique pattern is cast onto the plane defined by the detectors 18.

In the embodiment shown in FIG. 1, the number (N) of the detectors 18 is exactly four, including a first detector 40, a second detector 42, a third detector 44 and a fourth detector 46. The tiles 30 fully repeating the base pattern 24 are conceptually divided into N respective portions, which is the number (N) of detectors 18. For example, as there are four detectors in FIG. 1, each of the plurality of tiles 30 is divided into four respective portions, thus, the first tile 31 includes a first respective portion 31A, a second respective portion 31B, a third respective portion 31C and a fourth respective portion 31D.

Referring to FIG. 1, the plurality of detectors 18 is positioned in a spaced apart configuration 20 such that each of the detectors 18 captures at least the radiation passing through different ones of the N respective portions of the plurality of tiles 30. By positioning the detectors 18 in this fashion, sampling of the entire base pattern 24 is achieved. The different ones of the N respective portions of the plurality of tiles 30 combine to form the base pattern 24. The system 10 enables a full sampling of the base pattern 24 without having a continuous plane of detectors. The system 10 allows the use of position-sensitive detectors that are relatively small to achieve high quality coded-aperture images.

Referring to FIG. 1, the first detector 40 is positioned to capture the radiation 14 transmitted through the respective first portion 31A of a first one of the plurality of tiles 30 (first tile 31). The second detector 42 is positioned to capture the radiation 14 transmitted through the respective second portion 32B of a second one of the plurality of tiles 30 (second tile 32). The third detector 44 is positioned to capture the radiation 14 transmitted through the respective third portion 33C of a third one of the plurality of tiles 30 (third tile 33). The fourth detector 46 is positioned to capture the radiation 14 transmitted through the respective fourth portion 34D of a fourth one of the plurality of tiles 30 (fourth tile 34).

The different ones of the N respective portions of the plurality of tiles 30 combine to form the base pattern 24. In other words, when placed together, the respective first portion 31A of the first tile 31, the respective second portion 32B of the second tile 32, the respective third portion 33C of the third tile 33 and the respective fourth portion 34D of the fourth tile 34 combine to form or cover the entire sequence of the base pattern 24. Alternatively, the detectors 18 may be configured to capture the radiation 12 transmitted through multiple portions on the same tile.

Additionally, when in operation, if the location of the source 12 shifts (going from the position in FIG. 1 to the position in FIG. 2, for example), those tile portions will move to new regions. The detectors 18 are positioned this way for a certain orientation of the source 12, but for sources in other positions in the field of view, unique portions of the tiles 30 can still be selected that combine to form the base pattern 24. Stated differently, for any source position in the field of view (for example, the position of the source 12 in FIG. 1 or the position of the source 112 in FIG. 2), portions of tiles can be selected such that each of the plurality of detectors 18 captures the radiation passing through different ones of the N respective portions of the plurality of tiles 30, and portions of the plurality of tiles 30 combine to form the base pattern 24. This is somewhat analogous to a completed jigsaw puzzle. For each position of the source 12, the combination of pieces used to build the jigsaw puzzle of the base pattern 24 is unique. Moreover, partial tiles that only repeat a portion of the base pattern 24 may also contribute one or more pieces to the completed jigsaw puzzle, such that an image of the source 12 includes the radiation passing through the partial tile.

Referring to FIG. 1, a controller C is in communication with the plurality of detectors and has a processor P and tangible, non-transitory memory M on which instructions are recorded. Execution of the instructions by the processor P causes the controller C to reconstruct an image of the at least one source 12. The controller C may be configured to record a respective sequence of numbers (e.g., 1=transmission and 0=no transmission) as a function of time or spatial location, where the respective sequence of numbers are reconstructed to pinpoint the location, distribution and intensity of the source 12. The controller C may employ any reconstruction algorithm or method available to those skilled in the art. The controller C may be configured to control the operation of the detectors 18 and as well as acquisition, processing and storage of the radiation data.

The detectors 18 may be configured to be sensitive to the position of the radiation 14 that is detected and may be configured to localize radiation sources in all directions simultaneously. The detectors 18 may utilize Compton scattering to determine the spatial origin of the radiation 14. In one example, the detectors 18 each include a cadmium zinc telluride (CdZnTe) compound and a conductive material configured to apply an electrical potential on the cadmium zinc telluride (CdZnTe) compound. The detectors 18 may employ any sensor technology available to those skilled in the art.

Figure 2:
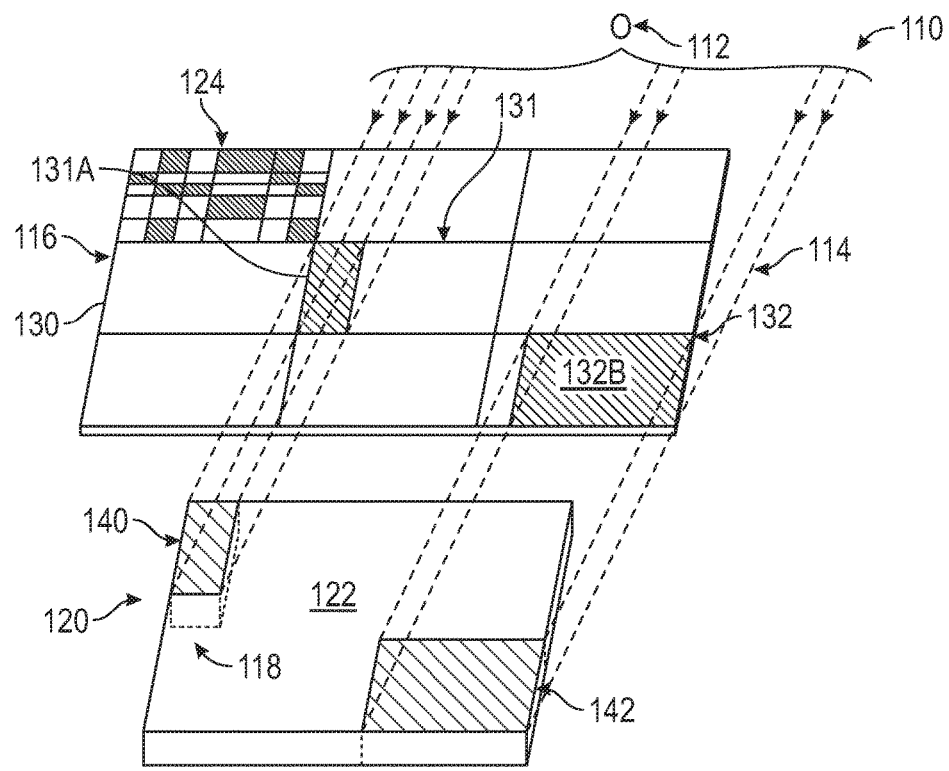
FIG. 2 is a second example of a schematic perspective view of a coded aperture system with a plurality of detectors in a spaced-apart configuration.

The radiation 14 may strike the mask 16 and detectors 18 at 90° (as shown in FIG. 1) or at a non-perpendicular angle (see FIG. 2). The distance between the mask 16 and the detector plane 22 is selected in order to set the desired field of view. For example, for a 90° by 90° field of the distance between the detector plane 23 and mask 16 may be set to be equal to half the width (Wb in FIG. 3) of the base pattern 24. The mask 16 may be moved farther away to reduce the field of view and hence increase the angular resolution. The mask 16 may be moved closer to the detector plane 22 to increase the field of view. In one example, the distance between the mask 16 and the detector plane 22 is about 2 cm for a 90° field of view and the source 12 is about a meter away.

When the source 12 is at an extended distance from the mask 16, the detectors 18 may sample more than is required for optimal sampling of the base pattern 24. In other words, some parts of the base pattern 24 may be sampled multiple times. In this case, controller C is configured to apply weighting factors to the multiple sampled areas in the detector space to obtain the best image, where the magnitude of the weighting factor is the reciprocal of the number of times each number of times the sampled area is sampled. The controller C may be configured to apply event weighting so the signal obtained is identical, or nearly identical, in amplitude to that which would be observed with a single continuous detector plane exactly sampling one base pattern.

Referring to FIG. 1, in this example, the detectors 18 and the tiles 30 may be shaped as squares. It is understood that the shape of the detectors 18 and the tiles 30 may be selected based on the application at hand. If the tiles 30 are shaped as squares, the quantity (Q) of tiles 30 has a minimum value of four and is a square of an integer (x) such that ($Q=x^2$, $x=2, 3, 4, \ldots$). If the detectors 18 are shaped as squares, the number (N) of detectors 18 has a minimum value of four and is a square of an integer (y) such that ($N=y^2$, $y=2, 3, 4, \ldots$).

A second embodiment is shown in FIG. 2. Referring to FIG. 2, the system 110 includes a mask 116 positioned such that radiation 114 from a source 112 strikes against the mask 116 prior to striking a plurality of detectors 118. Similar to the first embodiment, the plurality of detectors 118 is positioned in a spaced-apart configuration 120 on a detector plane 122. Referring to FIG. 2, the mask 116 is divided into a plurality of tiles 130 each repeating the base pattern 124. By tiling the base pattern 124 on the mask 116, a field of view is created where each source position casts a unique pattern on the detectors 118. As shown in FIG. 2, the detectors 118 may have unequal sizes and shapes.

In this embodiment, the number (N) of detectors 118 is two (see first detector 140 and second detector 142 in FIG. 2). Similar to the first embodiment, each of the tiles 130 are divided into N respective portions, which is the number (N) of detectors 118. Thus, each of the plurality of tiles 130 is conceptually divided into two respective portions. The first detector 140 is positioned to capture the radiation 114 transmitted through a respective first portion 131A of a first tile 131 and the second detector 142 is positioned to capture the radiation 114 transmitted through a respective second portion 132B of a second tile 132. Alternatively, the detectors 118 may be configured to capture the radiation 112 transmitted through multiple portions on the same tile.

The different ones of the N respective portions of the plurality of tiles 130 combine to form the base pattern 124. Stated differently, when placed together, the respective first portion 131A of the first tile 131 and the respective second portion 132B of the second tile 132 combine to form or cover the entire base pattern 124. Accordingly, the base pattern 124 may be fully sampled by the plurality of detectors 118 without requiring a continuous detector plane.

Figure 3:
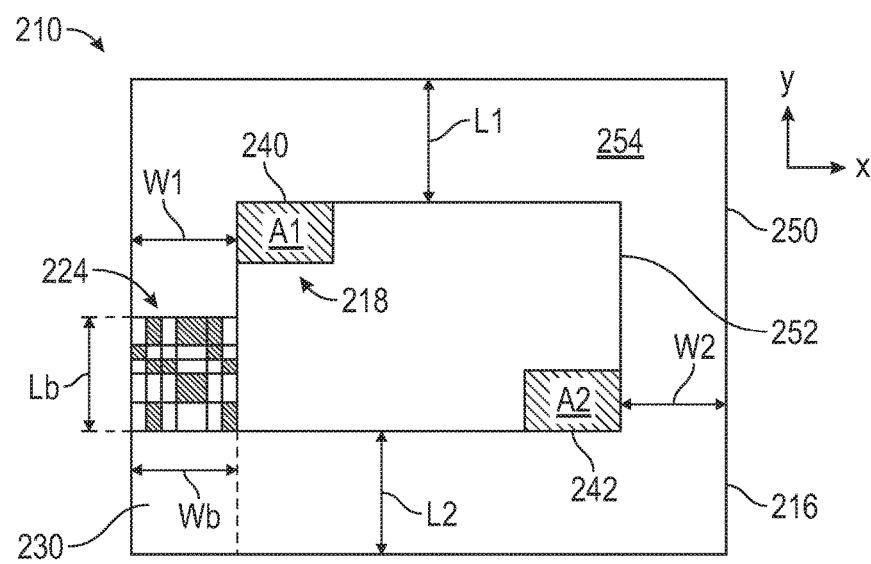
FIG. 3 is a schematic plan view of a third example of a coded aperture system with a plurality of detectors in a spaced-apart configuration, the plurality of detectors having a rectangular shape.

FIG. 3 is a plan view of a third example of a system 210 with a mask 216 and a plurality of detectors 218 in a spaced-apart configuration. Referring to FIG. 3, the mask 216 includes a plurality of tiles 230. It is to be understood that the shapes of the tiles 230 and detectors 218 may include, but is not limited to, circles, squares, hexagons and rectangles. A mask boundary 250 may be defined as the outer-most rectangle that can be drawn with the plurality of tiles 230 being located inside. The plurality of detectors 218 is positioned inside a detector boundary 252. The detector boundary 252 may be defined as the outer-most rectangle that can be drawn with the detectors 218 positioned inside.

Referring to FIG. 3, the detectors 218 include a first detector 240 and a second detector 242, which define respective areas of A1 and A2. The base pattern 224 of the mask 216 defines a base area. A magnified base area is obtained by the base area multiplied by a square of a magnification factor. The magnification factor is defined as the ratio of the source-to-detector distance ("SD" in FIG. 1) to the source-to-mask distance ("SM" in FIG. 1). The magnification factor occurs when the source 12, 112 is brought close to the mask 16, 116 and the mask shadow becomes larger on the detectors 18, 118. The system 210 may be configured such that a sum of the respective areas (A1+A2) of the detectors 18 is greater than or equal to the magnified base area.

Referring to FIG. 3, a peripheral region 254 is defined between the detector boundary 252 and the mask boundary 250. The peripheral region 254 defines a first peripheral length L1 and a second peripheral length L2, both in a first direction (the X-direction here). The peripheral region 254 defines a first peripheral width W1 a second peripheral width W2, both in a second direction (Y-direction) perpendicular to the first direction. Referring to FIG. 3, the base pattern 224 of the mask 216 defines a base pattern length Lb in the first direction and a base pattern width Wb in the second direction. A magnified base pattern length is obtained by the base pattern length Lb multiplied by the magnification factor. The system 210 may be configured such that a first sum (L1+L2) of the first peripheral length L1 and the second peripheral length L2 is greater than zero and less than the magnified base pattern length.

Referring to FIG. 3, the base pattern 224 of the mask 216 defines a base pattern width Wb in the second direction (Y-direction). A magnified base pattern width is obtained by the base pattern width Wb multiplied by the magnification factor. The system 210 may be configured such that a second sum (W1+W2) of the first peripheral width W1 and the second peripheral width W2 is greater than zero and less than the magnified base pattern width.

FIG. 4 is a plan view of a system 310 with a plurality of detectors 318 (detectors 340, 342, 344, 346) in a spaced-apart configuration and having a hexagonal shape. system 310 includes a mask 316 with a plurality of tiles 330. Referring to FIG. 4, a peripheral region 354 is defined between a detector boundary 352 and a mask boundary 350. In this embodiment, the detector boundary 352 and the mask boundary 350 have a hexagonal shape. The peripheral region 354 defines first and second peripheral lengths L1, L2, in a first direction, first and second peripheral widths W2, W2, in a second direction as well as first and second peripheral depths T1, T2, in a third direction.

Referring to FIG. 4, the base pattern 324 of the mask 316 defines a base pattern length Lb, a base pattern width Wb and a base pattern depth Tb in the first, second and third directions, respectively. A magnified base pattern length, width and depth is respectively obtained by multiplication with the magnification factor (SD/SM in FIG. 1) described above. The system 310 may be configured such that a first sum (L1+L2) of the first and second peripheral lengths L1, L2 is greater than zero and less than the magnified base pattern length, a second sum (W1+W2) of the first and second peripheral widths W1, W2 is greater than zero and less than the magnified base pattern width and a third sum (T1+T2) of the first and second peripheral depths T1, T2 is greater than zero and less than the magnified base pattern depth.

Referring now to FIG. 5, a side sectional view of a system 410 with a mask 416 and a plurality of detectors 418 (see detectors 440, 442) in a spaced-apart configuration is shown. The mask 416 includes tiles 431, 432 and 433. The mask 416 and detectors 418 are one-dimensional and configured to receive radiation 414. A peripheral region 454 is defined between a detector boundary 452 and the mask boundary 450. The peripheral region 454 defines a first peripheral length L1 and a second peripheral length L2 in a first direction. Referring to FIG. 5, the base pattern 424 of the mask 416 defines a base pattern length Lb in the first direction. A magnified base pattern length is obtained by the base pattern length Lb multiplied by the magnification factor. The system 410 may be configured such that a first sum (L1+L2) of the first peripheral length L1 and the second peripheral length L2 is greater than zero and less than the magnified base pattern length.

Additionally, referring to FIGS. 4 and 5, the system 310 (or system 410) may be configured such that a sum of the respective areas of the detectors 318 (or detectors 418) is greater than or equal to a magnified base area. The magnified base area is obtained by the base area of the respective base pattern 334 multiplied by a square of the magnification factor (SD/SM in FIG. 1).

For any position of a point source in the field of view, a unique shadow pattern is projected onto the detectors 18, 118, 218, 318, 418, shown in FIGS. 1-5. This is because the signal on the detectors is to be used to reconstruct the source distribution in order to resolve which source position created the pattern. The uniqueness may be ensured by employing non-repeating base pattern 24, 124, 224, 324, 424 and tiling it in all directions around a central tile such that a peripheral region satisfies 0<D1+D2<Db for each direction that the base pattern 24, 124, 224, 324, 424 extends.

The radius, height, depth and material of the mask 16, 116, 216, 316, 416 and the respective diameters, number of elements and relative sizes of the open and closed elements may be selected based on the application at hand. For gamma rays, high-density, high-Z materials may be used for the mask 16, 116. For fast neutrons, high-density, low-Z material may be used. For thermal neutrons, a material with high cross section (such as B-10 or Cd-113) may be employed. Optimal choice of parameters may depend on particle type, detector, desired field of view, desired resolution and other factors.

The controller C includes a computer-readable medium (also referred to as a processor-readable medium), including any non-transitory (e.g., tangible) medium that participates in providing data (e.g., instructions) that may be read by a computer (e.g., by a processor of a computer). Such a medium may take many forms, including, but not limited to, non-volatile media and volatile media. Non-volatile media may include, for example, optical or magnetic disks and other persistent memory. Volatile media may include, for example, dynamic random access memory (DRAM), which may constitute a main memory. Such instructions may be transmitted by one or more transmission media, including coaxial cables, copper wire and fiber optics, including the wires that comprise a system bus coupled to a processor of a computer. Some forms of computer-readable media include, for example, a floppy disk, a flexible disk, hard disk, magnetic tape, any other magnetic medium, a CD-ROM, DVD, any other optical medium, punch cards, paper tape, any other physical medium with first patterns of holes, a RAM, a PROM, an EPROM, a FLASH-EEPROM, any other memory chip or cartridge, or any other medium from which a computer can read.

Look-up tables, databases, data repositories or other data stores described herein may include various kinds of mechanisms for storing, accessing, and retrieving various kinds of data, including a hierarchical database, a set of files in a file system, an application database in a proprietary format, a relational database management system (RDBMS), etc. Each such data store may be included within a computing device employing a computer operating system such as one of those mentioned above, and may be accessed via a network in any one or more of a variety of manners. A file system may be accessible from a computer operating system, and may include files stored in various formats. An RDBMS may employ the Structured Query Language (SQL) in addition to a language for creating, storing, editing, and executing stored procedures, such as the PL/SQL language mentioned above.

The detailed description and the drawings or FIGS. are supportive and descriptive of the disclosure, but the scope of the disclosure is defined solely by the claims. While some of the best modes and other embodiments for carrying out the claimed disclosure have been described in detail, various alternative designs and embodiments exist for practicing the disclosure defined in the appended claims. Furthermore, the embodiments shown in the drawings or the characteristics of various embodiments mentioned in the present description are not necessarily to be understood as embodiments independent of each other. Rather, it is possible that each of the characteristics described in one of the examples of an embodiment can be combined with one or a plurality of other desired characteristics from other embodiments, resulting in other embodiments not described in words or by reference to the drawings. In other words, elements of various embodiments may be combined. Accordingly, such other embodiments fall within the framework of the scope of the appended claims.

What is claimed is:

1. A coded aperture system for imaging at least one source of radiation, the system comprising:
   a mask and a plurality of detectors positioned on a detector plane spaced apart from the mask;
   wherein the mask is characterized by a base pattern, the mask being configured to selectively transmit and selectively block the radiation striking the mask based in part on the base pattern;
   wherein the mask includes a plurality of tiles each repeating the base pattern;
   wherein a number of the plurality of detectors is N and each of the plurality of tiles is divided into N respective portions;
   wherein the plurality of detectors is positioned on the detector plane in a spaced apart configuration such that each of the plurality of detectors captures the radiation passing through different ones of the N respective portions of the plurality of tiles; and
   wherein the different ones of the N respective portions combine to form the base pattern.

2. The system of claim 1, wherein:
   the number of the plurality of detectors is exactly four;
   each of the plurality of tiles is divided into four respective portions, including a first respective portion, a second respective portion, a third respective portion and a fourth respective portion;
   a first of the plurality of detectors is positioned to capture the radiation passing through the respective first portion of a first one of the plurality of tiles;
   a second of the plurality of detectors is positioned to capture the radiation passing through the respective second portion of a second one of the plurality of tiles;
   a third of the plurality of detectors is positioned to capture the radiation passing through the respective third portion of a third one of the plurality of tiles; and
   a fourth of the plurality of detectors is positioned to capture the radiation passing through the respective fourth portion of a fourth one of the plurality of tiles.

3. The system of claim 1, wherein:
   a combination of the N respective portions of the plurality of tiles is unique for each position of the at least one source.

4. The system of claim 1, further comprising:
   a controller in communication with the plurality of detectors and having a processor and tangible, non-transitory memory on which instructions are recorded; and
   wherein execution of the instructions by the processor causes the controller to reconstruct an image of the at least one source.

5. The system of claim 1, wherein at least two of the plurality of detectors have a dissimilar size.

6. The system of claim 1, wherein the plurality of detectors is configured to be position sensitive.

7. The system of claim 1, wherein the base pattern is a modified uniformly redundant array (MURA) pattern.

8. The system of claim 1, wherein:
   the detector and the mask are shaped as squares;
   a quantity (Q) of the plurality of tiles is a square of an integer and has a minimum value of four; and
   the number (N) of the plurality of detectors is a square of an integer and has a minimum value of four.

9. The system of claim 1, wherein:
   the plurality of detectors defines a detector boundary and the mask defines a mask boundary;
   a peripheral region is defined between the detector boundary and the mask boundary, the peripheral region defining first and second peripheral lengths in a first direction;
   the base pattern of the mask defines a base pattern length in the first direction;
   a magnified base pattern length is obtained by the base pattern length multiplied by a magnification factor, the magnification factor being a ratio of a source-to-detector distance and a source-to-mask distance; and
   a first sum of the first and second peripheral lengths is greater than zero and less than the magnified base pattern length.

10. The system of claim 9, wherein:
    the detector boundary is an outer-most rectangle drawn with the plurality of detectors inside and the mask boundary is the outer-most rectangle drawn with the plurality of tiles inside;
    the base pattern of the mask defines a base pattern width in a second direction perpendicular to the first direction;
    the peripheral region defines first and second peripheral widths in the second direction;
    a magnified base pattern width is obtained by the base pattern width multiplied by the magnification factor; and
    a second sum of the first and second peripheral widths is greater than zero and less than the magnified base pattern width.

11. The system of claim 9, wherein:
the detector boundary is an outer-most hexagon drawn with the plurality of detectors inside;
the base pattern of the mask defines a base pattern width in a second direction and a base pattern depth in a third direction;
the peripheral region defines first and second peripheral widths in the second direction, the peripheral region defining first and second peripheral depths in the third direction;
a magnified base pattern width is obtained by the base pattern width multiplied by the magnification factor and a magnified base pattern depth is obtained by the base pattern depth multiplied by the magnification factor;
a second sum of the first and second peripheral widths is greater than zero and less than the magnified base pattern width; and
a third sum of the first and second peripheral depths is greater than zero and less than the magnified base pattern depth.

12. The system of claim 1, wherein:
the base pattern of the mask defines a base area;
a magnified base area is obtained by the base area multiplied by a square of a magnification factor, the magnification factor being a ratio of a source-to-detector distance and a source-to-mask distance; and
a sum of respective areas of the plurality of detector is greater than or equal to the magnified base area.

13. The system of claim 1, wherein:
the mask includes at least one partial tile repeating a portion of the base pattern; and
an image of the at least one source includes the radiation passing through the at least one partial tile.

14. A coded aperture method of imaging at least one source of radiation, the method comprising:
placing a mask relative to the source, the mask being characterized by a base pattern such that the mask selectively transmits the radiation and selectively blocks the radiation striking the mask based in part on the base pattern;
positioning a plurality of detectors on a detector plane spaced apart from the mask;
dividing the mask into a plurality of tiles each repeating the base pattern;
wherein a number of the plurality of detectors is N and each of the plurality of tiles is divided into N respective portions; and
positioning the plurality of detectors on the detector plane in a spaced apart configuration such that each of the plurality of detectors captures the radiation passing through different ones of the N respective portions of the plurality of tiles such that the different ones of the N respective portions combine to form the base pattern.

15. The method of claim 14, wherein the system includes a controller in communication with the detector and having a processor and tangible, non-transitory memory on which instructions are recorded, the method further comprising:
reconstructing an image of the at least one source, via the controller.

16. The method of claim 14, wherein:
a combination of the N respective portions of the plurality of tiles is unique for each position of the at least one source.

17. The method of claim 14, wherein the plurality of detectors defines a detector boundary and the mask defines a mask boundary, the method comprising:
defining a peripheral region between the detector boundary and the mask boundary with first and second peripheral lengths in a first direction;
obtaining a magnified base pattern length as a length of the base pattern in the first direction multiplied by a magnification factor, the magnification factor being a ratio of a source-to-detector distance and a source-to-mask distance; and
configuring the peripheral region such that a first sum of the first and second peripheral lengths is greater than zero and less than the magnified base pattern length.

18. The method of claim 17, further comprising:
defining the detector boundary as an outer-most rectangle drawn with the plurality of detectors inside and the mask boundary as the outer-most rectangle drawn with the plurality of tiles inside;
defining the peripheral region with first and second peripheral widths in the second direction;
obtaining a magnified base pattern width by multiplying a base pattern width by the magnification factor, the base pattern of the mask defining the base pattern width in a second direction perpendicular to the first direction; and
configuring the peripheral region such that a second sum of the first and second peripheral widths is greater than zero and less than the magnified base pattern width.

19. The method of claim 17, further comprising:
defining the detector boundary as an outer-most hexagon drawn with the plurality of detectors inside;
defining the peripheral region with first and second peripheral widths in the second direction and first and second peripheral depths in the third direction;
wherein the base pattern of the mask defines a base pattern width in a second direction and a base pattern depth in a third direction;
obtaining a magnified base pattern width and a magnified base pattern depth by multiplying the base pattern width and the base pattern depth by the magnification factor, respectively;
configuring the peripheral region such that a second sum of the first and second peripheral widths is greater than zero and less than the magnified base pattern width; and
configuring the peripheral region such that a third sum of the first and second peripheral depths is greater than zero and less than the magnified base pattern depth.

20. The method of claim 14, wherein the base pattern of the mask defines a base area, the method comprising:
defining a magnified base area as the base area multiplied by a square of a magnification factor, the magnification factor being a ratio of a source-to-detector distance and a source-to-mask distance; and
configuring the plurality of detectors such that a sum of respective areas of the plurality of detectors is greater than or equal to the magnified base area.

* * * * *